(12) United States Patent
Kim et al.

(10) Patent No.: US 7,576,341 B2
(45) Date of Patent: Aug. 18, 2009

(54) LITHOGRAPHY SYSTEMS AND METHODS FOR OPERATING THE SAME

(75) Inventors: Dong-Wook Kim, San Diego, CA (US); Sungho Jin, San Diego, CA (US); In Kyung Yoo, Kyongki-do (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 188 days.

(21) Appl. No.: 11/296,233

(22) Filed: Dec. 8, 2005

(65) Prior Publication Data
US 2006/0118735 A1 Jun. 8, 2006

Related U.S. Application Data

(60) Provisional application No. 60/634,138, filed on Dec. 8, 2004.

(51) Int. Cl.
*G21K 5/04* (2006.01)
(52) U.S. Cl. ............ 250/492.3; 250/492.2; 250/492.22; 438/798; 438/795
(58) Field of Classification Search ............... 250/492.1, 250/492.2, 492.22, 492.23, 492.24, 492.3; 438/798, 795
See application file for complete search history.

(56) References Cited

U.S. PATENT DOCUMENTS

| | | | | |
|---|---|---|---|---|
| 4,465,934 A | | 8/1984 | Westerberg et al. | |
| 4,554,458 A | * | 11/1985 | Behringer et al. | 250/492.2 |
| 4,634,874 A | * | 1/1987 | Ward | 250/492.2 |
| 4,981,532 A | * | 1/1991 | Takeshita et al. | 148/302 |
| 5,395,738 A | * | 3/1995 | Brandes et al. | 430/296 |
| 5,567,949 A | | 10/1996 | Okino | |
| 5,740,895 A | | 4/1998 | Bigley | |
| 5,831,272 A | | 11/1998 | Utsumi | |
| 5,892,231 A | * | 4/1999 | Baylor et al. | 250/398 |
| 6,429,443 B1 | | 8/2002 | Mankos et al. | |
| 6,492,647 B1 | * | 12/2002 | Katsap et al. | 250/492.2 |
| 6,812,473 B1 | * | 11/2004 | Amemiya | 250/492.22 |
| 2003/0189181 A1 | * | 10/2003 | Ohta et al. | 250/492.22 |
| 2004/0084637 A1 | * | 5/2004 | Yoo et al. | 250/492.24 |
| 2004/0150311 A1 | * | 8/2004 | Jin | 313/309 |

OTHER PUBLICATIONS

Bohlen, et al ("Electron-Beam Proximity Printing—A New High-Speed Lithography Method for Submicron Structures" IBM J. Res. Develp vol. 26, No. 5, Sep. 1982).*
H. Bohlen et al., Electron-Beam Proximity Printing—A New High-Speed Lithography Method for Submicron Structures, Sep. 1982, IBM J. Res. Develop., vol. 26, No. 5, pp. 568-579.

* cited by examiner

*Primary Examiner*—David A Vanore
*Assistant Examiner*—Michael Maskell
(74) *Attorney, Agent, or Firm*—Harness, Dickey & Pierce, P.L.C.

(57) ABSTRACT

A lithography system and method for operating the same. The lithography system may include a cathode adapted to emit an electron beam, a beam-homogenizing structure, capable of increasing at least one of the uniformity and energetic of the electron beam, and a mask adapted to accelerate the electron beam to form a pattern on a wafer.

13 Claims, 13 Drawing Sheets

LITHOGRAPHY SYSTEMS AND METHODS FOR OPERATING THE SAME

PRIORITY STATEMENT

This U.S. non-provisional application claims the benefit of priority under 35 U.S.C. § 119(e) of U.S. Provisional Application No. 60/634,138, filed Dec. 8, 2004, the entire contents of which are incorporated herein by reference.

BACKGROUND OF THE INVENTION

For advancement of ultra-high-density electronic devices, finer resolution patterning techniques and tools may be useful. Next generation lithography (NGL) candidates, for example, extreme ultra violet lithography (EUVL), electron beam projection lithography (EPL), and proximity electron beam lithography (PEL), are competing to become major tools for sub-65 nm patterning. Recent trends seem to indicate that EUVL and EPL are the strongest NGL candidates; however, the costs of prototypical tools may be high.

A proximity electron beam lithography (PEL) technique, which may use a 1:1 (or 1×) projection exposure of the resist material, has attracted much attention due to its relatively mature technology and substantially reduced cost projected for such a system. Ion beam or x-ray based lithography approaches are also based on a 1:1 stencil mask printing, like PEL, but electron beam based PEL technology may be more appealing due to its mature technology and industry-friendly system configuration.

The concept of PEL has been recently revisited and successfully implemented in a more modern format as a low energy electron beam proximity projection lithography (LEEPL) system. Progress has been made in various fabrication technologies and supporting infrastructures, for example, (1) thin-film resist materials compatible with low-energy electrons at several keV regime, (2) fine-featured stencil mask fabrication; (3) high-performance electron-beam writers for delineating circuit patterns on a mask; and/or (4) backbone technologies for high precision alignment and stage systems that are compatible with a high-vacuum environment inherent to the use of electron beams.

In contrast to 1:4 demagnifying EPL methods, which may require complex and/or expensive projection lenses, PEL employs real-size printing with the use of a stencil mask placed as close as approximately 30 µm above a wafer. In current PEL technology, a conventional hot electron cathode, which has a point source form, may be used and may limit the system downsizing and cost reduction. Relatively recent cold cathodes, for example, field emitter arrays (FEAs), photocathodes, and/or tunneling cathodes (metal-insulator-metal or metal-insulator-semiconductor structures), have desirable characteristics for vacuum microelectronic devices, for example, a large projection area (>1 mm$^2$) emission capability, a small energy spread (<0.5 eV), and/or highly directional nature of the electrons (directed normal to the resist layer surface). Compared with conventional electron sources, the properties associated with cold cathodes may simplify electron optics and/or reduce the system cost.

SUMMARY

Example embodiments of the present invention relate to a lithography system, for example, a proximity electron beam lithography system with unity magnification, wherein a beam homogenizer produces uniform or more uniform electron beams. Example embodiments of the present invention disclose a lithography system, for example, a proximity electron beam lithography system including a beam-homogenizing structure.

Example embodiments of the present invention also disclose a lithography system, for example, a proximity electron beam lithography system including a cold cathode structure containing field emitters, for example, carbon nanotubes as an electron source, which can operate a multitude of electron guns simultaneously to enhance the throughput.

Example embodiments of the present invention may also be directed to a method of operation for producing uniform or more uniform electron beams from an electron gun. Example embodiments of the present invention may reduce lithography cost, for example, the e-beam lithography cost and/or serve as economically attractive and industrially viable NGL tools. Example embodiments of the present invention disclose a 1:1 lithography system, for example, a proximity electron beam lithography system including a cold cathode, a stencil/membrane mask, a beam-homogenizing structure further including electric and magnetic field sources which modulate the electron trajectory to produce uniform electron beams.

Example embodiments of the present invention are also directed to operation methods for inducing lateral movement of projected e-beams for homogenized electron beam exposure on resist layer. In example embodiments, various kinds of cold cathodes, for example, field emitters, tunneling cathodes, and photocathodes, may be used as the electron source.

In an example embodiment, the homogenizer may solve the emission non-uniformity problem, which can be caused by many possible origins, the presence of discrete emitter array positions, variations in emitter microstructure and emission characteristics among neighboring emitter cells, sensitive nature of the Fowler-Nordheim tunneling mechanism, contamination-caused degradation, defective structures generated during fabrication, and other origins.

Example embodiments of the present invention may be useful for high-density device and circuit fabrications.

Example embodiments of the present invention may be directed to a lithography system including a cathode adapted to emit an electron beam, a beam-homogenizing structure, capable of increasing at least one of the uniformity and energetic of the electron beam, and a mask adapted to accelerate the electron beam to form a pattern on a wafer.

In example embodiments of the present invention, the cathode may be a cold cathode.

In example embodiments of the present invention, the cold cathode may be at least one of a field emitter array (FEA), a photocathode and a tunneling cathode.

In example embodiments of the present invention, the beam-homogenizing structure may include at least one emitter tip and at least one gate.

In example embodiments of the present invention, the beam-homogenizing structure may spatially alter helical trajectories of electrons of the electron beam.

In example embodiments of the present invention, the beam-homogenizing structure may include at least one power supply and at least one magnet.

In example embodiments of the present invention, an electric field of the at least one power supply and a magnetic field of the at least one magnet may be parallel.

In example embodiments of the present invention, the at least one power supply may supply an applied voltage V, including a DC voltage and a smaller AC voltage.

In example embodiments of the present invention, the at least one magnet may include at least two magnets, a first magnet facing the cathode and a second magnet facing the mask.

In example embodiments of the present invention, the at least one magnet may be at least one of a permanent magnet and an electromagnet.

In example embodiments of the present invention, the permanent magnet may be at least one of an Nd—Fe—B magnet and a rare earth cobalt magnet.

In example embodiments of the present invention, the mask may be at least one of a stencil mask and a membrane mask.

In example embodiments of the present invention, the stencil mask may include an array of alternately relatively electron permeable thin regions and relatively electron-impermeable thicker regions.

In example embodiments of the present invention, the membrane mask may include a thicker, relatively electron-impermeable supporting layer, a thinner patterned and relatively electron-permeable layer, and a thinner relatively electron-permeable membrane. In example embodiments of the present invention, the lithography system may be a proximity electron beam lithography (PEL) system.

Example embodiments of the present invention may be directed to an electron gun including a field emitter array (FEA) adapted to emit an electron beam, the FEA including at least one emitter tip and at least one gate and a mask adapted to accelerate the electron beam to form a pattern on a wafer.

Example embodiments of the present invention may be directed to a method of patterning a wafer including emitting an electron beam, increasing at least one of the uniformity and energetic of the electron beam, and accelerating the electron beam to form the pattern on a wafer.

In example embodiments of the present invention, the accelerating may include accelerating the electron beam between a cathode and a mask.

In example embodiments of the present invention, the increasing may include inducing a helical motion in electrons of the electron beam.

In example embodiments of the present invention, the helical motion may be induced by a magnet for beam focusing.

Further areas of applicability of example embodiments of the present invention will become apparent from the detailed description provided hereinafter. It should be understood that the detailed description and specific examples, while indicating the example embodiments of the invention, are intended for purposes of illustration only and are not intended to limit the scope of the invention.

BRIEF DESCRIPTION OF THE DRAWINGS

For a better understanding of the present invention, example embodiments are described below, considered together with the accompanying drawings.

Figure 1:
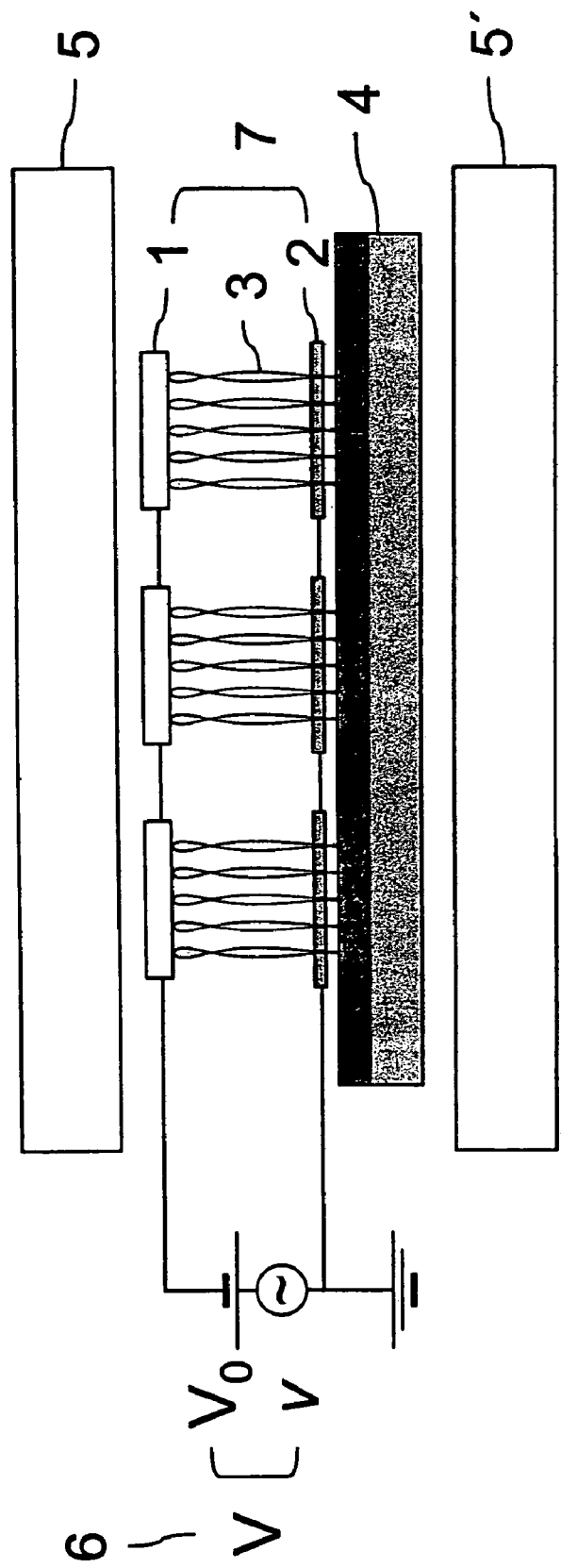
FIG. 1 is a schematic diagram of a proximity electron beam lithography system in accordance with an example embodiment of the present invention.

It is to be understood that these drawings are for the purposes of illustrating concepts of example embodiments of the present invention and are not to scale. For example, the dimensions of some of the elements are exaggerated relative to each other.

DETAILED DESCRIPTION OF EXAMPLE EMBODIMENTS

The present invention will now be described more fully with reference to the accompanying drawings, in which example embodiments of the invention are shown. The invention may, however, be embodied in many different forms and should not be construed as being limited to the example embodiments set forth herein; rather, these example embodiments are provided so that this disclosure will be thorough and complete, and will fully convey the concept of the invention to those skilled in the art. Like reference numerals in the drawings denote like elements.

Example illustrative embodiments of the present invention are disclosed herein. However, specific structural and functional details disclosed herein are merely representative for purposes of describing example embodiments of the present invention. This invention, however, may be embodied in many alternate forms and should not be construed as limited to only the example embodiments set forth herein.

Accordingly, while example embodiments of the invention are capable of various modifications and alternative forms, embodiments thereof are shown by way of example in the drawings and will herein be described in detail. It should be understood, however, that there is no intent to limit example embodiments of the invention to the particular forms disclosed, but on the contrary, example embodiments of the invention are to cover all modifications, equivalents, and alternatives falling within the scope of the present invention.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments of the present invention. As used herein, the term "and/or" includes any and all combinations of one or more of the associated listed items.

The terminology used herein is for the purpose of describing particular embodiments only and is not intended to be limiting of example embodiments of the invention. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

The following description of example embodiment(s) is merely exemplary in nature and is in no way intended to limit the invention, its application, or uses.

FIG. 1 schematically illustrates a proximity electron beam (PEL) lithography system in an example embodiment of the present invention. Electron beams 3 may be emitted from a cold cathode 1 and accelerated by a mask 2 to form a pattern on a resist-coated wafer 4. Parallel electric and magnetic fields, which may be generated by a high voltage power supply 6 and a magnet 5, 5', may be used to produce uniform and/or energetic electron beams. A variety of cold cathodes may be used in an example PEL system, including field emitter arrays (FEAs), either fabricated Spindt tip cathodes or synthesized nanostructures with high field enhancement factors, for example, carbon nanotubes (CNT). FEAs are known to have poor emission uniformity. Such non-uniformity may be caused by the discrete nature of the emitter array, variations in emitter microstructure and emission characteristics among neighboring emitter cells, sensitive nature of the Fowler-Nordheim tunneling mechanism to changes in geometry and electronic properties of the emitter tips, contamination-caused degradations, defective structures generated during fabrication, and other factors. According to example embodiments of the present invention, a non-uniformity problem may be solved by a beam homogenizer structure and/or operation methods introduced to the e-beam lithographic system, described below.

In a beam homogenizer structure in accordance with an example embodiment of the present invention, helical trajectories of electrons are spatially altered in the presence of the magnetic field and modulating electric field so that the slightly out-of-focused electron beam has, over the exposure time, an overall homogenizing effect on any particular spot on the e-beam resist layer on the substrate to be patterned.

In addition to field emitters, photocathodes and tunneling cathodes may be as cold cathodes. In an example embodiment, a photocathode may be used in an ultrahigh vacuum to reduce contamination.

Figure 2:
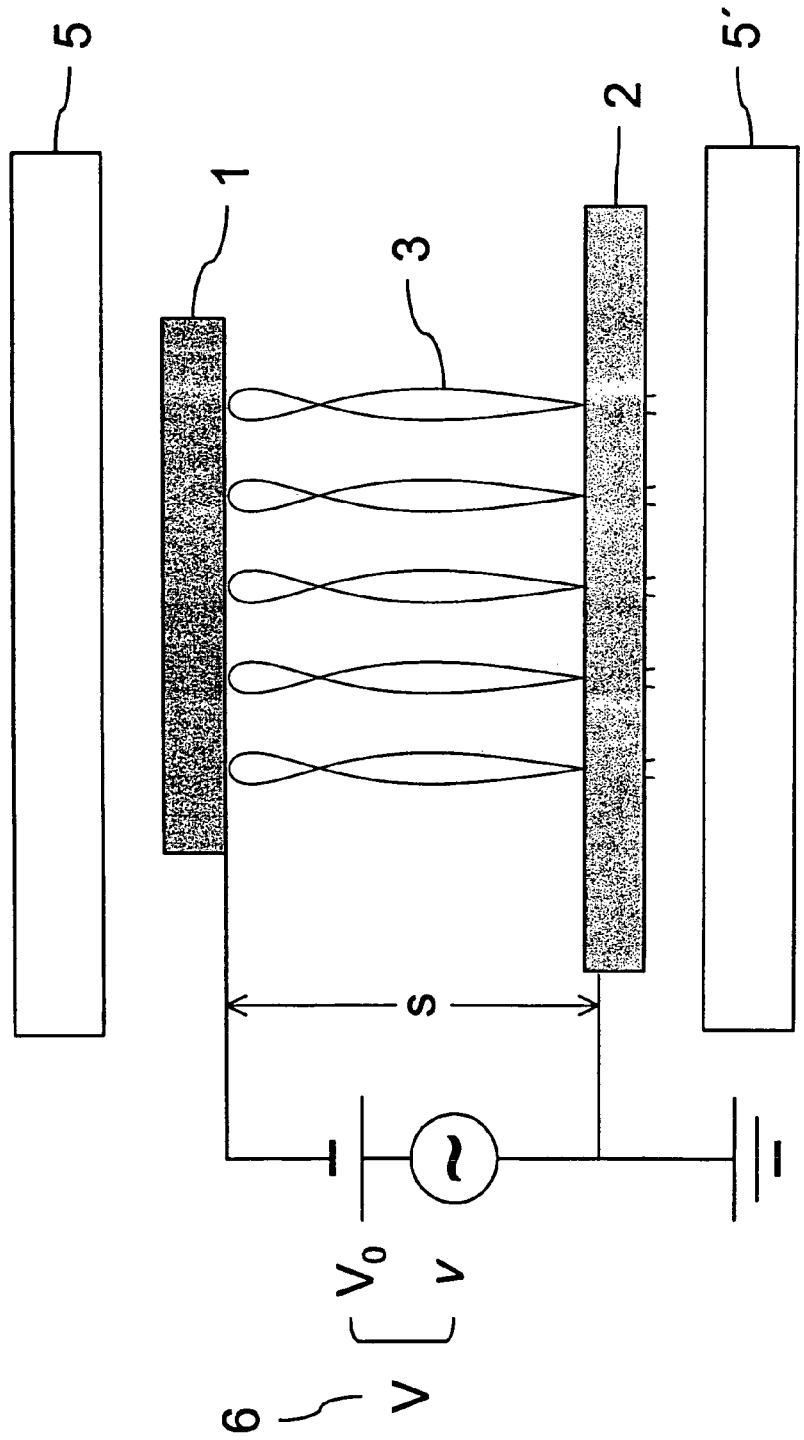
FIGS. 2 and 3 illustrate the effect of applied electric and magnetic fields on electron trajectories under 1:1 projection conditions.

FIG. 2 illustrates an example embodiment including a cathode 1, a mask 2, and electron trajectories 3 under a 1:1 projection condition. Parallel electric and magnetic fields may be applied by a high voltage source 6 and poles of the magnets 5 and 5'. Although parallel alignment of the electric and magnetic fields are shown in FIG. 3, in other example embodiments, non-parallel alignment may also be used, a difference being the rotational direction of electrons—either clock-wise or counter-clockwise.

If the electric field is parallel to the propagation direction of an electron, perpendicular momentum of an electron may be conserved. Therefore, beam blur, e.g., the minimum resolution of the pattern, may be determined by the initial perpendicular momentum of the emitted electron. The magnets 5 and 5' may be permanent magnets with their magnetic poles vertically oriented, for example, Nd—Fe—B magnets or rare earth cobalt magnets structured, aligned and magnetized along the z-direction. Alternatively, electromagnets may also be utilized.

Figure 3:
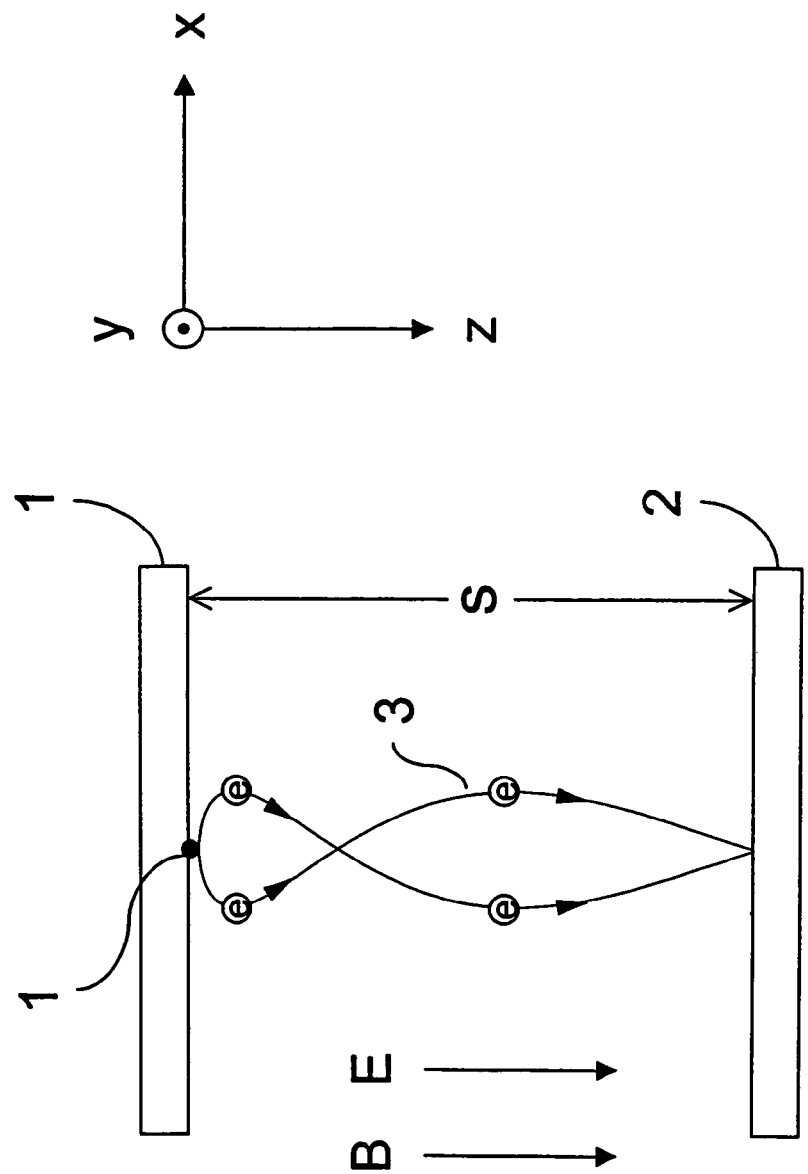

FIG. 3 illustrates an example trajectory of an electron in the 1:1 projection condition. For simplicity, a point source 1' is assumed on a cathode 1 surface. Electrons 3 will experience the Lorentz force F, as in Eq. (1)

$$\vec{F} = -e(\vec{v} \times \vec{B} + \vec{E}) \quad (1)$$

where B denotes the magnetic field, E is the accelerating electric field, e is the electron charge and v is the electron velocity. An electron with $v\perp$, a velocity component perpendicular to the magnetic field, will show a simple circular motion in the xy plane with radius $\rho$, as given by Eq. (2)

$$\rho \equiv \frac{mv_\perp}{eB} \quad (2)$$

where m is the electron mass. The period T of the in-plane circular motion is given by $$T \equiv \frac{2\pi m}{eB} \quad (3)$$

For example, the electron is assumed to start from the origin, (0,0,0), and solutions for the equation of motions in Eq. (1) are:

$$x = \rho\left(1 - \cos\frac{2\pi t}{T}\right) \quad (4)$$

$$y = \rho\sin\frac{2\pi t}{T} \quad (5)$$

$$z = \frac{1}{2}\frac{eE}{m}t^2 + v_\parallel t \quad (6)$$

where $v_\parallel$ is a velocity component parallel to the magnetic field. The electron 3 may be accelerated by the electric field, E, and will reach the mask 2 at z=s. The travel time $t_s$ can be obtained by solving Eq. (6).

$$t_s = \frac{-v_1 + \sqrt{v_1^2 + 2\frac{eE}{m}s}}{\frac{eE}{m}} \quad (7)$$

If all the emitted electrons from a point location on the emitter surface, after traveling toward the mask for a time of t, can return to the same point location in the x-y plane at a distance z=s, t should be equal to T. Corresponding focusing voltage $V_0$ with small $v_\parallel$'s, can be approximated by $$V_0 \cong \frac{eB^2s^2}{2\pi^2 m} \quad (8)$$

Figure 4:
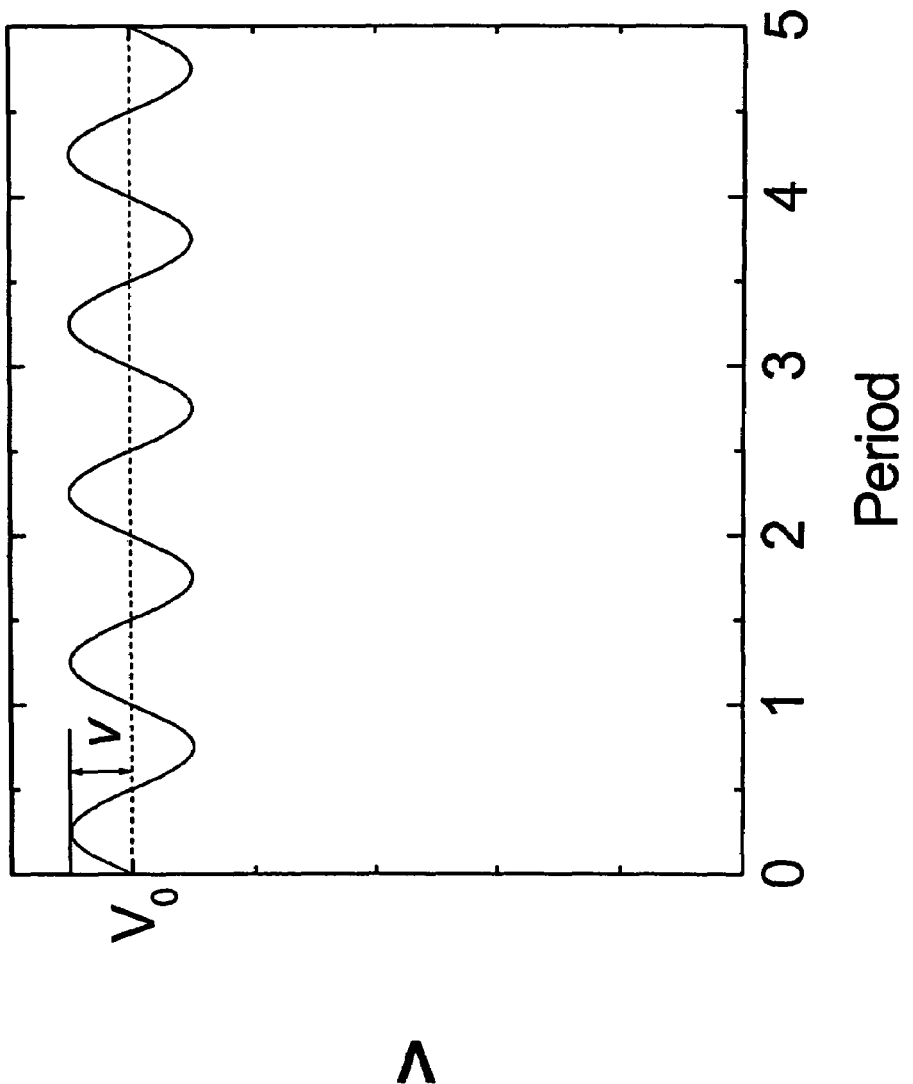
FIG. 4 illustrates an example waveform of an added acceleration voltage for generating uniform electron beams in an example embodiment of the present invention.

FIG. 4 illustrates an example of an applied voltage V, including DC voltage $V_0$ and a smaller AC voltage v. When V is equal to $V_0$, a focused electron beam may be obtained. Electrons emitted from a certain point on the emitter will form a point spot, with the same x and y coordinates of the emission point, on the mask. However, deviation of the voltage, V, may result in an out-of-focused electron beam, which will hit a point on the mask with a finite distance from the point where the focused e-beam will arrive.

Detailed electron trajectories may depend on the initial electron energy, $U_0$, and emission angle, $\theta = \tan^{-1}(v\perp/v\|)$. Because emitted electrons have random distribution of $U_0$ and $\theta$, electrons from a point on the cathode will form a disk on the mask under the modulation of AC voltage, v.

Figure 5:
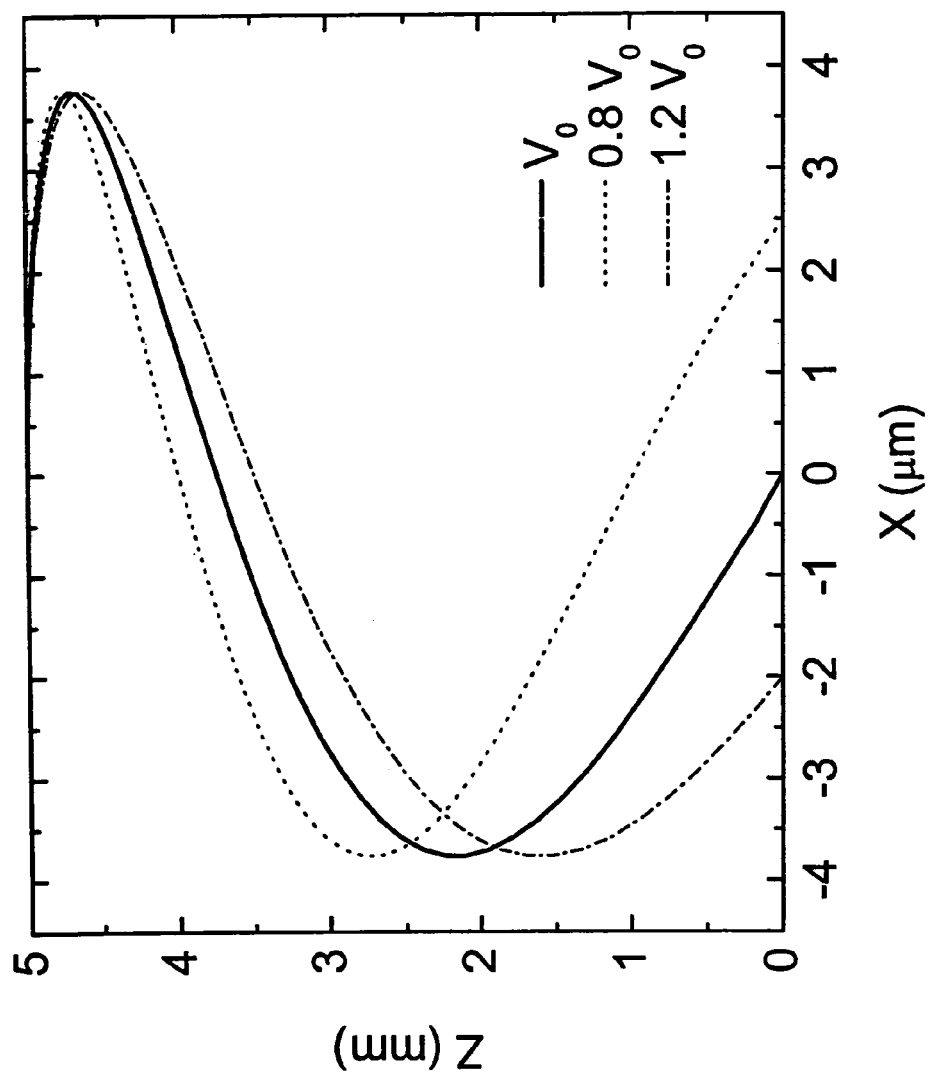
FIG. 5 illustrates example electron trajectories in an xz plane between the cathode and the mask under various acceleration voltages.

FIG. 5 illustrates example electron trajectories (x and z) when $V \neq V_0$. In an example embodiment of the present invention, the cathode-to-anode distance (s), the magnetic field (B), $U_0$, and $\theta$ may be 5 mm, 0.2 T, 0.1 eV, and 45°, respectively. $V_0$ is estimated to be 8.91 kV by Eq. (8).

In an example embodiment, a large emission angle (45°) may be used to check fine pattern capability in the worst case. It noted that $\rho$ may be the same for the three cases due to the constant magnetic field. In an example embodiment, the desired operation range of the magnetic field B may be 0.01-2 T, for example, 0.05-0.5 T, the initial electron energy $U_0$ in the range of 0.02-1 eV, for example, 0.05-0.5 eV, the emission angle $\theta$ in the range of <60°, for example, <45° and the range of applied AC voltage amplitude ($v/V_0$) may be 0.01-0.50, for example, 0.05-0.20.

The exposure time for each mask may be given by $\tau = [P \cdot (S/M)]^{-1}$, where P is the number of wafers processed in unit time and S and M are total area of wafer and the mask area, respectively. If the target throughput for a 12-inch wafer is 60 wafers per hour and the mask area is 1 mm², exposure time for each mask, $\tau$, is about 0.8 msec. Therefore, the voltage modulation frequency may be larger than 7.9 kHz. The desired voltage modulation frequency may be determined by the emission current, because electron dose by the exposure should be enough to activate the resist material. In general, the frequency may be in the range of 100-100,000 Hz, for example, 1000-10,000 Hz. Redundant exposure is also possible, under sufficiently high voltage modulation frequency, and may compensate for any time dependent fluctuation of the emission current and improve the emission uniformity further. The desired repetition number of exposure shots is in the range of 1-100, for example, in the range of 2-5.

Figure 6:
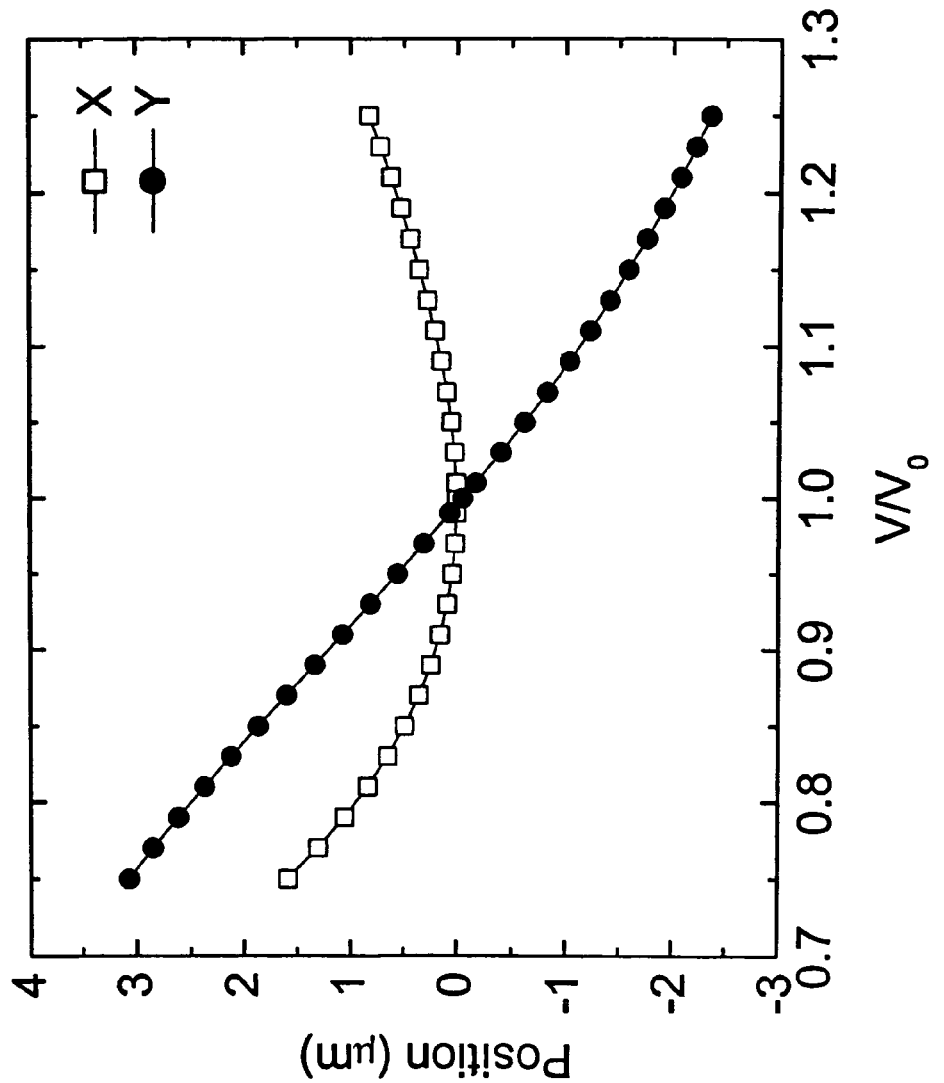
FIG. 6 illustrates example altered electron positions (x and y) on the mask under various acceleration voltages.

FIG. 6 illustrates in-plane electron positions (x and y) on the mask of electrons, in an example embodiment of the present invention emitted from (0,0) at the emitter surface, under various voltages from $0.75V_0$ to $1.25V_0$. A larger (smaller) magnitude of acceleration voltage than $V_0$ reduces (increases) the travel time to reach z=s, and electrons cannot return to (0,0) on the mask. Deviation of x position, can be as large as ~2 μm at |v|=$0.2V_0$ (e.g., V=$0.8V_0$ or V=$1.2V_0$).

Figure 7:
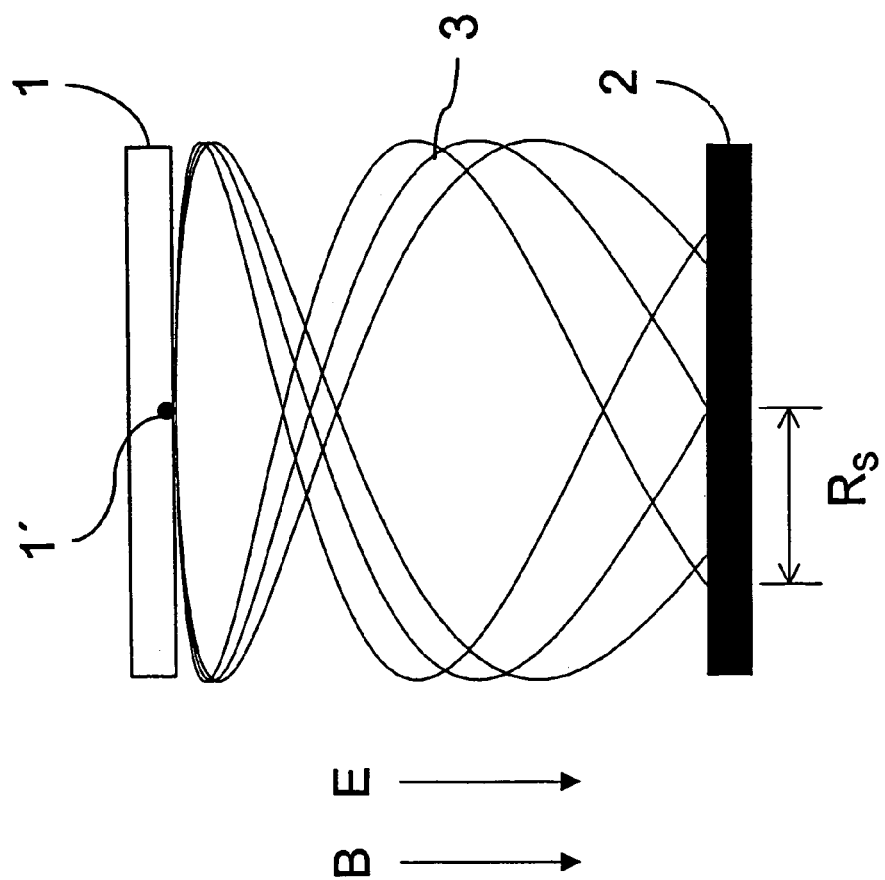
FIG. 7 illustrates example electron trajectories under the varying voltage and the principle of uniform beam production.

FIG. 7 schematically illustrates electron trajectories under the intentionally varied voltage and the principle of uniform beam production in an example embodiment of the present invention. Because the emitted electrons 3 should have random initial energy and emission angle distribution, electrons 3 from a single point 1' on the cathode 1 may form a disk-shaped projection on the mask 2 under varying voltage, V. The radius of the disk may be referred to as 'scanning radius', $R_s$, as illustrated in FIG. 7. The estimated results in FIG. 6 indicate that $R_s$ is at least 2 μm, when |v|=$0.2V_0$.

Figure 8:
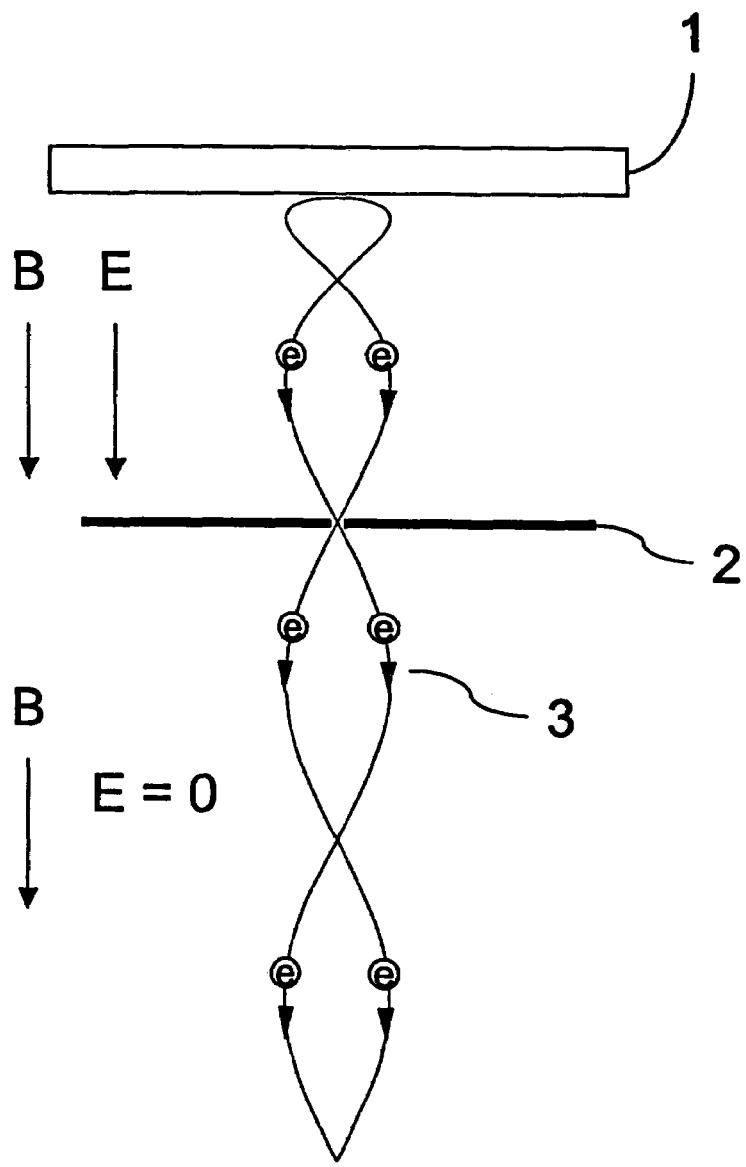
FIG. 8 illustrates an arrangement of a cathode, a mask with an aperture at the center, applied electric/magnetic fields, and resulting electron trajectories in an example embodiment of the present invention.

FIG. 8 illustrates an electron trajectory under 1:1 projection conditions, when the mask 2, with an aperture at the center, is placed at the focal plane in an example embodiment of the present invention. Some of the electrons 3 may pass through the aperture as shown in FIG. 8. After passing through the aperture, electrons 3 may follow a simple helical trajectory because there is no accelerating field. $v\|$, the velocity component parallel to the magnetic field, will be constant at $z \geq s$ and is given by $$v_\|(z \geq s) = \frac{eE}{m}t_s + v_\|(z=0) \quad (9)$$

Figure 9:
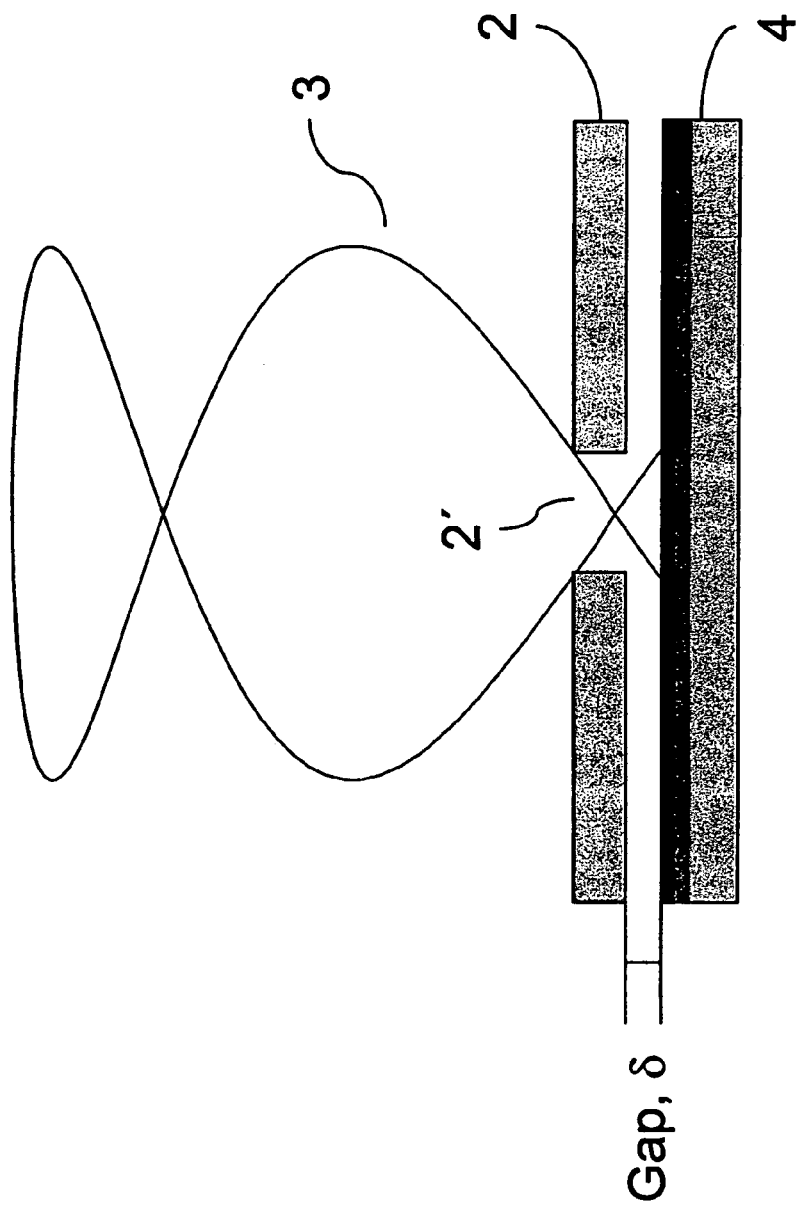
FIG. 9 illustrates arrangement of electron beam trajectories, a mask with an aperture, a wafer coated with a resist layer, and the principle of pattern transfer in an example embodiment of the present invention.

FIG. 9 illustrates the principle of pattern transfer using the electron beam trajectories, a mask with an aperture, and a resist coated wafer. Electrons 3 may follow a simple helical trajectory in the region between the mask 2 and the wafer 4. To obtain smaller feather patterns, $\zeta$ should be made smaller. However, larger $\zeta$ allows enough room for reliable and safe lateral translation of wafers 4 during the process. To meet such conflicting demands, the desirable range of $\zeta$ can be in the range of 1-100 μm, for example, 5-50 μm, for example, 10-30 μm. Because there is no voltage difference between the mask 2 and the wafer 4 in an example embodiment of the present invention, the problem of scattered secondary electrons may be reduced.

Electrons 3 emitted from a single point on the cathode may form a disk-shaped projection on the wafer 4, with a diameter D, during the time of variation of the voltage, V. To estimate D, the e-beam trajectory may be considered again. After passing through the aperture 2', $v\|$ of an electron 3 will be constant and the travel time from the mask 2 to the wafer 4, $t_\zeta$, is given by $$t_\delta = \frac{\delta}{v_\|(z=s)} \quad (10)$$

If an electron passes (0,0, s), in-plane positions of an electron at the wafer 4 (e.g., z=s+$\zeta$), $x_\zeta$ and $y_\zeta$ are given by $$x_\delta = \rho\left(1 - \cos\frac{2\pi t_\delta}{T}\right) \quad (11)$$

$$y_\delta = \rho\sin\frac{2\pi t_\delta}{T} \quad (12)$$

D can be simply estimated by the following equation.

$$D = 2[\sqrt{x_\delta^2 + y_\delta^2}] \quad (13)$$

Figure 10:
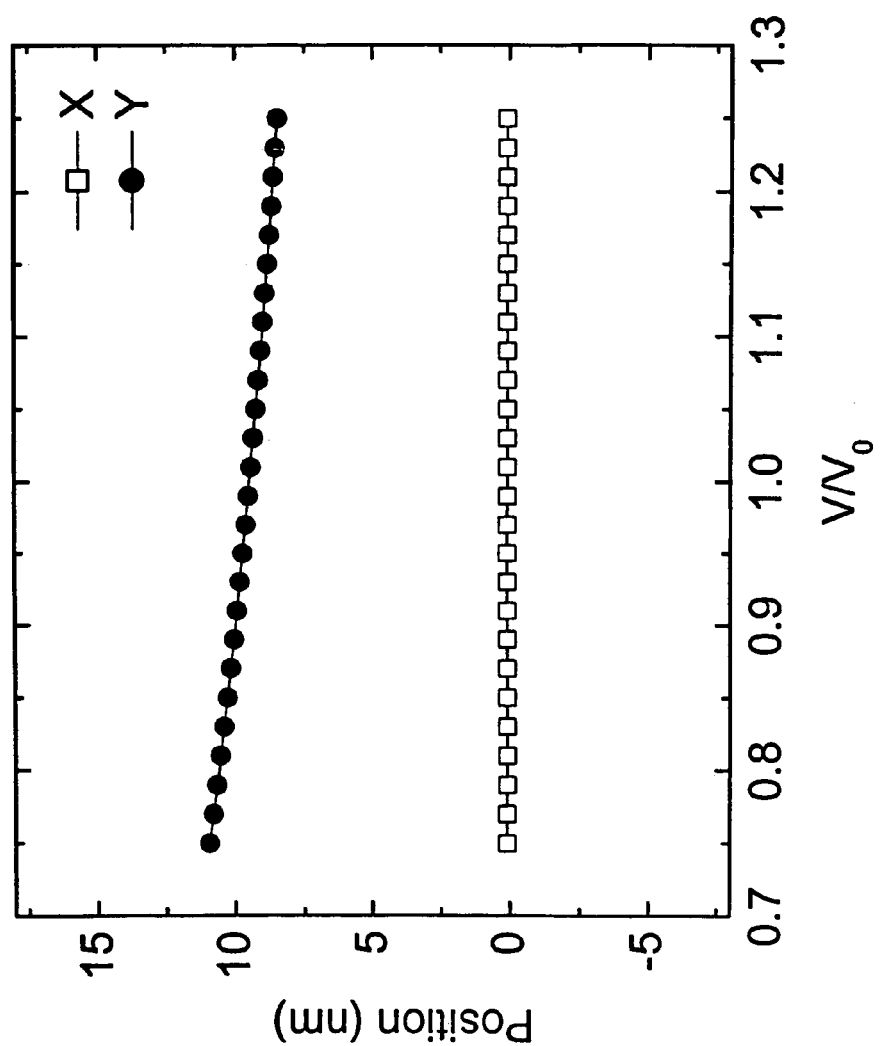
FIG. 10 illustrates an example of induced alteration of electron positions (x and y) on the wafer by using various acceleration voltages.

FIG. 10 illustrates $x_\zeta$ and $y_\zeta$ for various voltages from $0.75V_0$ to $1.25V_0$. In this calculation, the cathode-to-anode distance (s), the magnetic field (B), initial electron energy ($U_0$), and emission angle ($\theta$) are 5 mm, 0.2 T, 0.1 eV, and 45°, respectively. $V_0$ is 8.91 kV and $\zeta$ may be set to be 20 μm.

In an example embodiment, a large emission angle (45°) may be chosen to estimate the worst case D. The above result illustrates that D can be about 20 nm in the wide range of voltage variation in the case of $\zeta$=20 μm. A larger magnetic field may reduce D further and may transfer smaller patterns.

Therefore sub-100 nm patterning, for example, sub-65 nm patterning, can be readily achieved by a simple optics.

Figure 11:
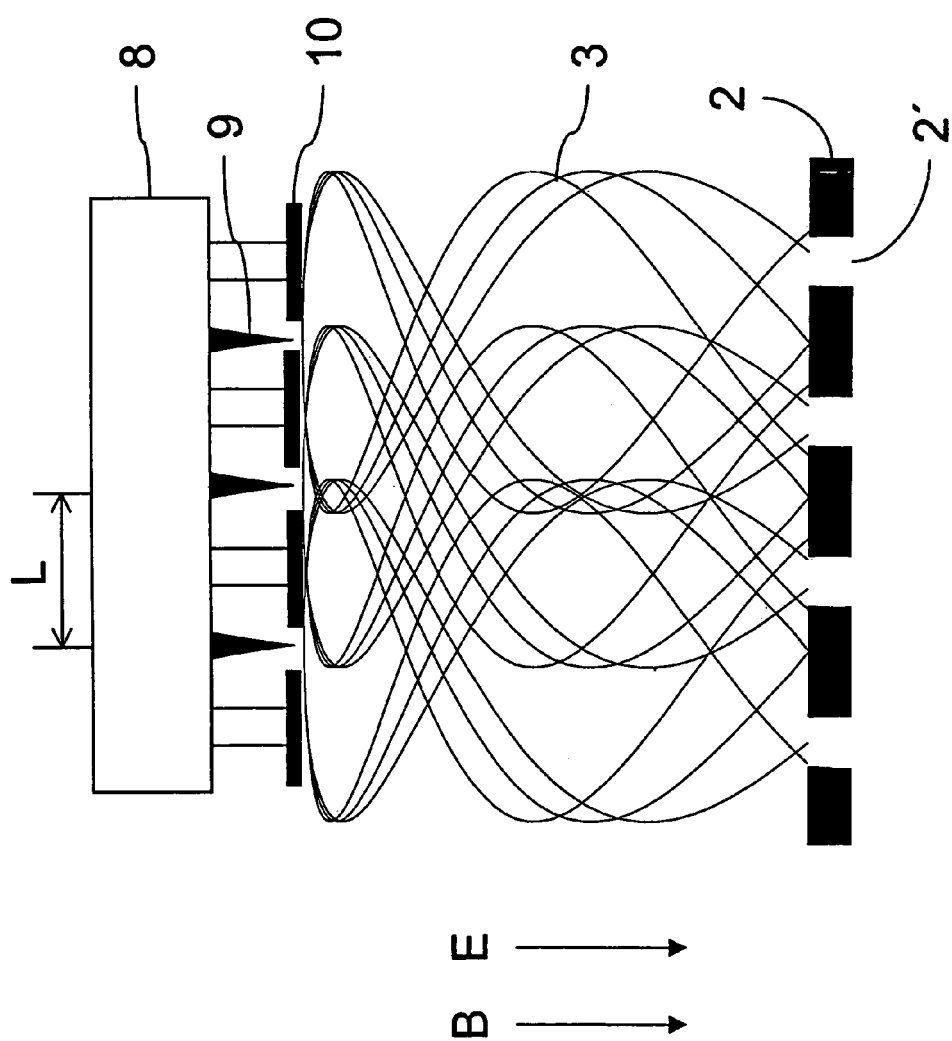
FIG. 11 illustrates a schematic diagram of an electron gun assembly in accordance with an example embodiment to the present invention, which includes a gated field emitter array, a mask, and an electron beam homogenizing structure.

FIG. 11 illustrates the principle of uniform beam generation with a schematic diagram of an electron gun assembly in accordance with an example embodiment of the present invention, which includes a field emitter array 8 and a mask 2. The field emitter array 8 may include emitter tips, for example, sharp emitter tips 9 and gates 10 to extract electrons. If the spacing between adjacent emitter tips, L, is larger than the scanning distance, $R_s$, electron beam 3 can be homogenized at the mask 2. The number of emitter tips, N, contributing to a 3-beam impinging on a point on the mask, can be estimated by $\pi R_s^2/L^2$. For example, N can be as large as 78.1 when L~0.4 μm and $R_s=2$ μm. A 'virtually' uniform e-beam 3 can be achieved, although the cathode itself shows poor emission uniformity, for example, because of the discrete nature of the emitters in the array. An example area of the cold cathode and the mask 2 may be in the range of 0.2-2000 mm$^2$, for example, 0.5-50 mm$^2$. Larger area of the mask 2 can increase throughput, however, attention has to be paid to ensure the parallel alignment of the mask with respect to the wafer surface.

Figure 12:
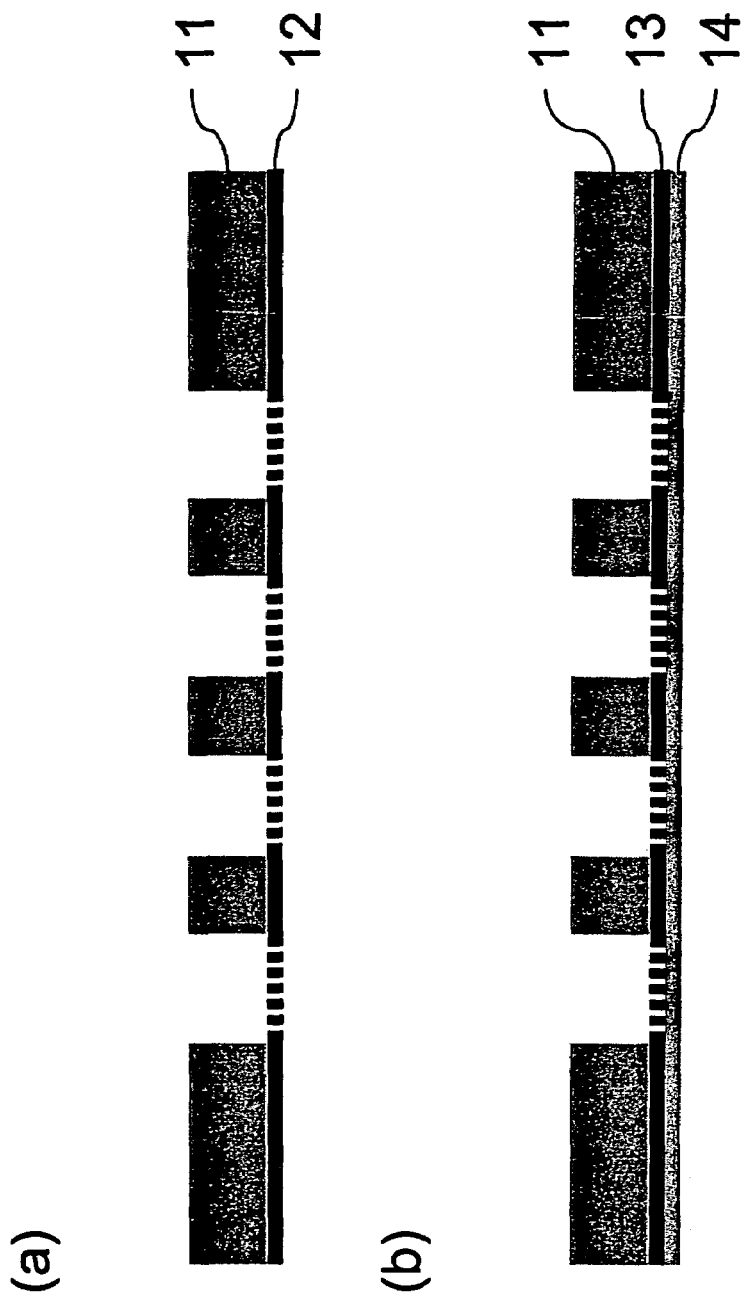
FIGS. 12(a) and (b) illustrate cross sectional diagram of alternative masks useful for e-beam lithographic systems in accordance with an example embodiment of the present invention.

FIGS. 12(*a*) and (*b*) illustrate cross sectional diagram of two masks useful for an e-beam lithographic system with a beam-homogenizing structure in accordance with an example embodiment of the present invention. The mask 2 in FIGS. 12(*a*) and (*b*) may constitute an anode to which a voltage, V, can be applied to establish an electric field between the mask 2 and the cathode 1 in FIG. 2. The mask 2 may be both electrically conductive (so as to apply electric field) and non-magnetic (so as to avoid magnetostatic interactions with the magnet field). To render electrical conductivity to the mask 2, the selection of the mask material can be made from conductive materials such as doped Si, SiC, or other semiconductors and metallic materials, or doped diamond or diamond-like-carbon (DLC) materials. Alternatively, the conductivity can be rendered by depositing a thin layer (e.g., 1-20 nm thickness) of a conductive material such as an amorphous carbon, graphite, or relatively light weight metal layer Al, Ti, V, Cr.

FIG. 12(*a*) is an example of a stencil mask, which may include of an array of alternately relatively electron permeable thin regions and relatively electron-impermeable thicker regions. Stencil masks may include two layers of substantially different thicknesses. The thicker layer 11, with a thickness in the range of 10~1000 μm, may mechanically supports the whole mask structure and enable handling of the mask. The thicker layer 11 may also be made electrically conductive, for example, by employing a n-type doped Si wafer material. If the thickness of the thick region is below ~100 μm, another even thicker frame (or a handle) may be used to additionally support the mask structure. A thinner layer 12 may have a thickness in the range of 5~1000 nm, for example, 10-100 nm, and fine hole patterns are formed only on this thinner layer.

FIG. 12(*b*) illustrates an alternative mask configuration using thin membrane 14 to form electron-penetrating regions. The mask 2 may include a thick, relatively electron-impermeable supporting layer 11, a thin patterned and relatively electron-permeable layer 13, and another thin relatively electron-permeable membrane 14. The membranes may be made of a low atomic number thin film to allow high transmittance of electrons, for example, $SiN_x$, $SiO_x$, and diamond-like carbon. The bottom membrane 14 may improve the structural stability of the mask and also enables a closed-loop patterning such as 'donut' or 'picture-frame' patterning. While the mask configurations of FIGS. 12(*a*) and (*b*) are examples the use of an even simpler type of stencil masks, including only desired patterned holes, lines and other shaped but without the membrane 12, may also be used.

Figure 13:
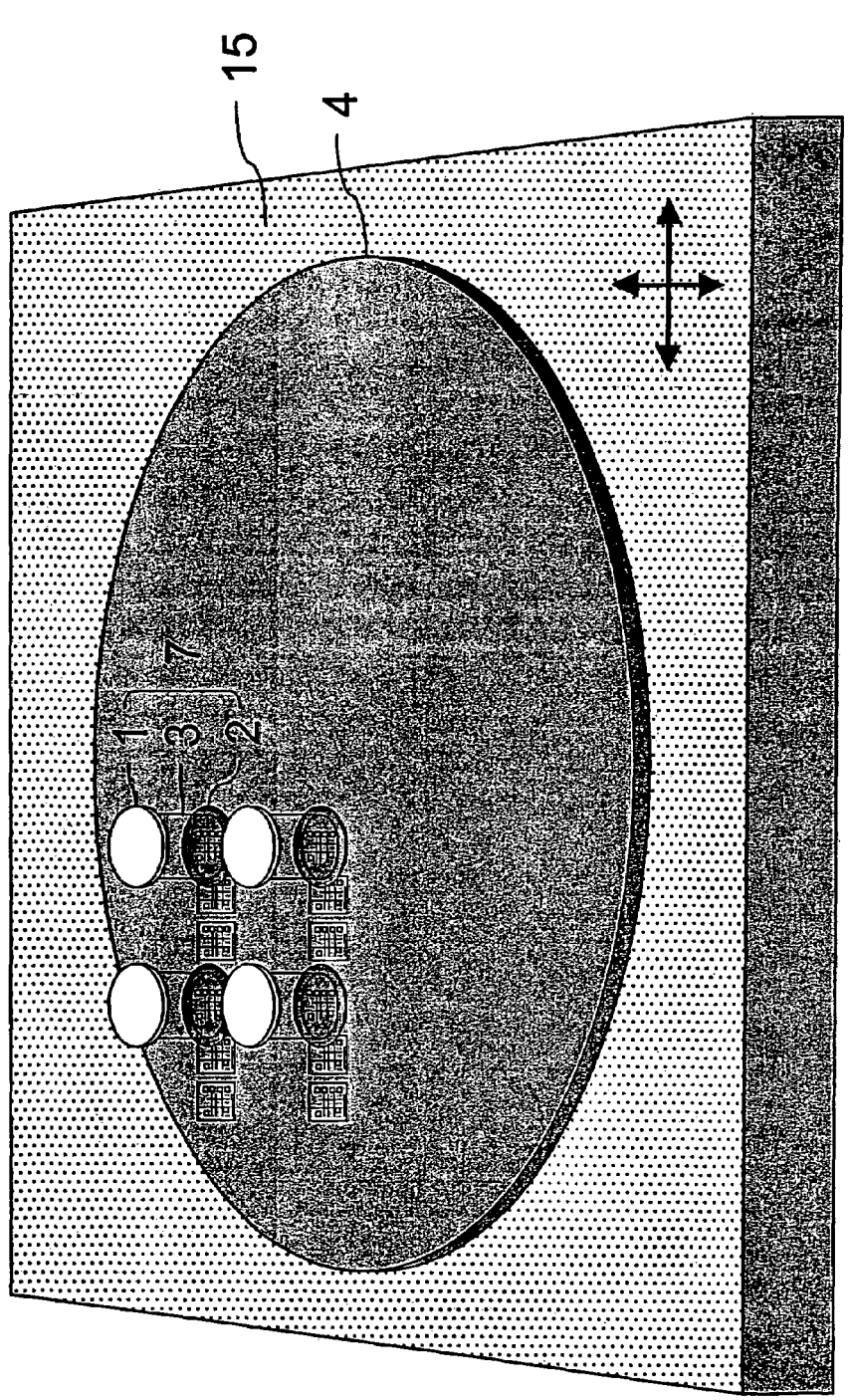
FIG. 13 schematically illustrates an example embodiment of a proximity electron beam lithography system with multiple cathode-and-mask assemblies and an x-y wafer translation stage in accordance with an example embodiment of the present invention.

FIG. 13 schematically illustrates a perspective view of a proximity electron beam lithography system with an array of multiple electron guns and mask assemblies 7 (only four are shown in the figure for the sake of simplicity) and a wafer stage 15 to be 3-beam patterned in accordance with an example embodiment of the present invention. A typical uniform magnetic field area (1~100 cm$^2$) can be much larger than the size of the electron gun and mask assembly (0.01~1 cm$_2$). A much larger, uniform magnetic field area of e.g., 1000 cm$^2$ can also be provided using permanent magnetic materials such as Nd—Fe—B or rare earth cobalt magnets. If a smaller magnet size is desired for various operational reasons, example embodiments to the present invention may optionally incorporate a translational stage by which the wafer can be moved sideways for 'scan and repeat' exposure of the much larger wafer surface. For example, in the case of a wafer size (e.g., 729 cm$^2$ for a 12 inch wafer) being much larger than the uniform magnetic field area, the wafer 4 can be translated by a translation stage 15, while poles of the magnet and electron gun assemblies remain stationary.

In the uniform magnetic field zone, the multiple assemblies 7 can be operated simultaneously and patterns can be transferred, as illustrated in FIG. 13. For example, the number of assemblies 7 can be, for example, as 16, if each cathode area comprising an array of field emitters is 1 mm$^2$ and the center-to-center distance between neighboring assemblies 7 is 3 mm. In this example, the uniform magnetic field zone can be made larger than 1 cm$^2$, which is readily achievable. After exposure, wafers can be translated and exposure may be repeated until patterns can be translated and exposure is repeated until patterns can be transferred and written onto the whole wafer.

Example embodiments of the present invention may use a variety of cold cathodes including field emitters, photocathodes, or tunneling cathodes. For field emitters, a uniform blanket of vertically aligned carbon nanotubes, a patterned array, or gated array of nanotubes may be utilized. Other types of conductive nanowires with similar sharp and high-aspect-ratio configuration may also be used as the field emitter material. Emitter structures such as an array of nanocones coated with low-work function materials may also be used, as disclosed in U.S. provisional application Ser. No. 60/568,643 by Jin et al., "ARTICLE COMPRISING CARBIDE AND NITRIDE NANO ELECTRON EMITTERS AND FABRICATION METHOD THEREOF" filed on May 6, 2004, the entire contents of which are hereby incorporated by reference in their entirety.

Example embodiments of the present invention may use a variety of beam-homogenizing structures, as set forth above. For example, the beam-homogenizing structure may be a separate element, as shown in FIGS. 1 and 2 or may be implemented part of the electron gun or cathode, as shown in FIG. 11.

Example embodiments of the present invention may use a variety of masks, as set forth above. For example, a stencil mask may be used as shown in FIG. 12(*a*) or a membrane mask may be used as shown in FIG. 12(*b*). Example embodiments of the present invention may be used in a variety of lithography systems, for example, a proximity electron beam lithography (PEL) system, or other lithography system.

It is understood that the above-described example embodiments are illustrative of only a few of the many possible embodiments, which can represent applications of the invention. Numerous and varied other arrangements can be made by those skilled in the art without departing from the spirit and scope of the invention.

What is claimed:

1. A lithography system comprising:
   a cathode adapted to emit an electron beam;
   a beam-homogenizing structure, capable of increasing at least one of the uniformity and energy of the electron beam, the beam-homogenizing structure including,
      at least one power supply, the at least one power supply supplying an applied voltage V, including a DC voltage and a smaller AC voltage and
      at least one magnet; and
   a mask adapted to accelerate the electron beam to form a pattern on a wafer, the mask being within the electron beam, the mask being fabricated of a conductive material and electrically connected to the at least one power supply.

2. The lithography system of claim 1, wherein said cathode is a cold cathode.

3. The lithography system of claim 2, wherein said cold cathode is at least one of a field emitter array (FEA), a photocathode and a tunneling cathode.

4. The lithography system of claim 3, wherein said beam-homogenizing structure includes at least one emitter tip and at least one gate.

5. The lithography system of claim 1, said beam-homogenizing structure spatially altering helical trajectories of electrons of the electron beam.

6. The lithography system of claim 1, wherein an electric field of the at least one power supply and a magnetic field of the at least one magnet are parallel.

7. The lithography system of claim 1, the at least one magnet including at least two magnets, a first magnet facing the cathode and a second magnet facing the mask.

8. The lithography system of claim 1, wherein the at least one magnet is at least one of a permanent magnet and an electromagnet.

9. The lithography system of claim 8, wherein the permanent magnet is at least one of an Nd—Fe—B magnet and a rare earth cobalt magnet.

10. The lithography system of claim 1, wherein said mask is at least one of a stencil mask and a membrane mask.

11. The lithography system of claim 10, wherein the stencil mask includes an array of alternately relatively electron permeable thin regions and relatively electron-impermeable thicker regions.

12. The lithography system of claim 10, wherein the membrane mask includes a thicker, relatively electron-impermeable supporting layer, a thinner patterned and relatively electron-permeable layer, and a thinner relatively electron-permeable membrane.

13. The lithography system of claim 1, wherein the lithography system is a proximity electron beam lithography (PEL) system.

* * * * *